(12) United States Patent
Rose et al.

(10) Patent No.: US 11,954,408 B2
(45) Date of Patent: Apr. 9, 2024

(54) STACKING OF ROTOR BLADE AEROFOIL SECTIONS TO ADJUST RESONANT FREQUENCIES

(71) Applicant: ROLLS-ROYCE plc, London (GB)

(72) Inventors: Martin Rose, Nottingham (GB); Stuart Marshall, Derby (GB)

(73) Assignee: ROLLS-ROYCE plc, London (GB)

( * ) Notice: Subject to any disclaimer, the term of this patent is extended or adjusted under 35 U.S.C. 154(b) by 652 days.

(21) Appl. No.: 16/726,992

(22) Filed: Dec. 26, 2019

(65) Prior Publication Data

US 2020/0233991 A1 Jul. 23, 2020

(30) Foreign Application Priority Data

Jan. 22, 2019 (GB) ...................................... 1900863

(51) Int. Cl.
*G06F 30/17* (2020.01)
*F01D 5/14* (2006.01)
*F01D 5/16* (2006.01)
*F04D 29/38* (2006.01)
(Continued)

(52) U.S. Cl.
CPC ............. *G06F 30/17* (2020.01); *F01D 5/141* (2013.01); *B23P 15/02* (2013.01); *B23P 15/04* (2013.01); *F01D 5/16* (2013.01); *F04D 29/38* (2013.01); *F05D 2230/50* (2013.01); *F05D 2260/81* (2013.01); *F05D 2260/961* (2013.01)

(58) Field of Classification Search
CPC ...... F01D 5/16; F01D 5/141; F05D 2260/961; F05D 2230/50; F05D 2230/60; G06F 30/17; F04D 29/38; F04D 29/384; B23P 15/02; B23P 15/04
See application file for complete search history.

(56) References Cited

U.S. PATENT DOCUMENTS

| 1,502,903 A | * | 7/1924 | Campbell | ............. F01D 21/003 416/61 |
| 10,677,266 B1 | * | 6/2020 | Warner | ................. F04D 29/544 |
| 2008/0134504 A1 | | 6/2008 | Schoenenborn | |

(Continued)

FOREIGN PATENT DOCUMENTS

EP 3029270 A1 6/2016
EP 3 263 839 A1 1/2018

OTHER PUBLICATIONS

May 13, 2020 Extended Search Report issued in European Patent Application No. 19219307.6.

(Continued)

*Primary Examiner* — Christopher Verdier
*Assistant Examiner* — Michael K. Reitz
(74) *Attorney, Agent, or Firm* — Oliff PLC

(57) ABSTRACT

A method of designing a modified aerofoil shape, the method comprising the steps of: determining a plurality of resonant frequencies of a baseline aerofoil shape; determining that one of the resonant frequencies falls within a predetermined range of frequencies; providing a plurality of aerofoil sections defining the baseline aerofoil shape; and defining a modified aerofoil shape by displacing at least one of the plurality of aerofoil sections relative to its baseline position in the baseline aerofoil shape until one of the plurality of resonant frequencies previously falling within the range of frequencies is shifted outside the range of frequencies.

8 Claims, 9 Drawing Sheets

(51) Int. Cl.
   *B23P 15/02*   (2006.01)
   *B23P 15/04*   (2006.01)

(56) References Cited

U.S. PATENT DOCUMENTS

| | | | |
|---|---|---|---|
| 2010/0150729 A1* | 6/2010 | Kirchner | F01D 5/12 |
| | | | 416/223 R |
| 2013/0094942 A1* | 4/2013 | MacKay | F01D 5/145 |
| | | | 29/889.21 |
| 2014/0358500 A1* | 12/2014 | Morris | G06F 30/17 |
| | | | 703/2 |
| 2015/0063985 A1 | 3/2015 | Richter et al. | |
| 2015/0110604 A1* | 4/2015 | Calza | F01D 5/225 |
| | | | 415/119 |
| 2017/0074281 A1 | 3/2017 | Li et al. | |
| 2017/0241269 A1* | 8/2017 | Jones | F01D 25/06 |
| 2019/0107123 A1* | 4/2019 | Veitch | F04D 29/666 |
| 2019/0241269 A1* | 8/2019 | Martin | B64D 11/0604 |
| 2020/0190984 A1* | 6/2020 | Tarquinio | F01D 5/16 |

OTHER PUBLICATIONS

Jul. 17, 2019 Search Report issued in Great Britain Patent Application No. 1900863.0.

* cited by examiner

STACKING OF ROTOR BLADE AEROFOIL SECTIONS TO ADJUST RESONANT FREQUENCIES

This disclosure claims the benefit of UK Patent Application No. GB 1900863.0, filed on 22 Jan. 2019, which is hereby incorporated herein in its entirety.

The present disclosure relates to a method of designing a modified aerofoil shape.

Gas turbine engines include aerofoils of various types such as, for instance, rotating and static aerofoils used in fans, compressors and turbines. During operation of gas turbine engines, aerofoils within the engine are subject to vibrations due to airflow through the engine (e.g. forced response from upstream or downstream blade rows) and mechanical vibration caused by parts moving within engine. The frequencies of these vibrations generally vary from engine to engine.

A given engine can have several frequencies that may cause damage to an aerofoil within the engine if the aerofoil resonates at one of the frequencies. In some cases the frequency of the excitation source can vary with engine speed to give a predefined range of frequencies across the engine's operating envelope sometimes referred to in the art as a 'keep out zone' or KOZ.

When designing an aerofoil for a given engine, the KOZ of that engine can be calculated or determined through performance modelling. In response, the aerofoil designer may then endeavour to ensure that the natural resonant frequencies of the aerofoil do not fall within the KOZ.

However, gas turbine engine aerofoils are subject to design restrictions, as they must also comply with a number of other criteria such as integrity and aerodynamic requirements. Meeting all of these criteria may result in a baseline aerofoil shape with one or more natural resonant frequency mode of the aerofoil falling within the KOZ.

In previously considered solutions, an aerofoil designer may need to compromise one of the above criteria in order to shift the one or more natural resonant frequency modes out of the KOZ. While this prevents damage to the aerofoil, the performance of the aerofoil is undesirably compromised in another respect.

Additionally, in previously considered solutions, modifications to the aerofoil shape tend to result in all of the natural resonant frequencies being shifted in the same direction. This can result in one natural frequency mode being shifted into the KOZ as an adjacent natural frequency mode is shifted out of the KOZ.

The present disclosure provides an improved method of designing an aerofoil, in which a minor modification is made to the baseline aerofoil shape to shift the natural resonant frequencies out of the KOZ.

According to a first aspect of the disclosure there is provided a method of designing a modified aerofoil shape, the method comprising the steps of:
 determining a plurality of resonant frequencies of a baseline aerofoil shape;
 determining that one of the resonant frequencies falls within a predetermined range of frequencies;
 providing a plurality of aerofoil sections defining the baseline aerofoil shape; and defining a modified aerofoil shape by displacing at least one of the plurality of aerofoil sections relative to its baseline position in the baseline aerofoil shape until one of the plurality of resonant frequencies previously falling within the range of frequencies is shifted outside the range of frequencies.

Optionally, the step of providing a plurality of aerofoil sections defining the baseline aerofoil shape comprises dividing the baseline aerofoil shape into a plurality of aerofoil sections.

Optionally, one of the plurality of resonant frequencies previously falling within the range of frequencies is shifted past an upper limit of the predetermined range of frequencies.

Optionally, one of the plurality of resonant frequencies previously falling within the range of frequencies is shifted past a lower limit of the predetermined range of frequencies.

Optionally, the plurality of resonant frequencies includes two resonant frequencies adjacent one another in the frequency domain, and wherein the method comprises:
 displacing at least one of the plurality of aerofoil sections relative to its baseline position until one of the two resonant frequencies is shifted past a lower limit of the range of frequencies; and
 displacing at least one of the plurality of aerofoil sections relative to its baseline position until the other of the two resonant frequencies is shifted past an upper limit of the range of frequencies.

Optionally, at least one of the plurality of aerofoil sections is displaced relative its baseline position so as to vary its position along a chord-wise axis of the baseline aerofoil shape.

Optionally, the plurality of aerofoil sections comprises a stack of N two-dimensional slices equally spaced apart along a span of the baseline aerofoil shape.

Optionally, the step of displacing at least one of the plurality of aerofoil sections relative to its baseline position comprises displacing an aerofoil section substantially equidistant between a hub and a tip of the baseline aerofoil shape, for example at a location between 40-60% of a span of the aerofoil between the hub and the tip.

Optionally, the aerofoil sections at the hub and the tip are not displaced.

The method may be computer implemented.

According to a second aspect of the disclosure there is provided a non-transitory computer readable medium comprising instructions which, when executed by a processor, cause performance of a method in accordance with the first aspect.

As noted elsewhere herein, the present disclosure may relate to a gas turbine engine. Such a gas turbine engine may comprise an engine core comprising a turbine, a combustor, a compressor, and a core shaft connecting the turbine to the compressor. Such a gas turbine engine may comprise a fan (having fan blades) located upstream of the engine core.

Arrangements of the present disclosure may be particularly, although not exclusively, beneficial for fans that are driven via a gearbox. Accordingly, the gas turbine engine may comprise a gearbox that receives an input from the core shaft and outputs drive to the fan so as to drive the fan at a lower rotational speed than the core shaft. The input to the gearbox may be directly from the core shaft, or indirectly from the core shaft, for example via a spur shaft and/or gear. The core shaft may rigidly connect the turbine and the compressor, such that the turbine and compressor rotate at the same speed (with the fan rotating at a lower speed).

The gas turbine engine as described and/or claimed herein may have any suitable general architecture. For example, the gas turbine engine may have any desired number of shafts that connect turbines and compressors, for example one, two or three shafts. Purely by way of example, the turbine connected to the core shaft may be a first turbine, the compressor connected to the core shaft may be a first compressor, and the core shaft may be a first core shaft. The engine core may further comprise a second turbine, a second compressor, and a second core shaft connecting the second turbine to the second compressor. The second turbine, second compressor, and second core shaft may be arranged to rotate at a higher rotational speed than the first core shaft.

In such an arrangement, the second compressor may be positioned axially downstream of the first compressor. The second compressor may be arranged to receive (for example directly receive, for example via a generally annular duct) flow from the first compressor.

The gearbox may be arranged to be driven by the core shaft that is configured to rotate (for example in use) at the lowest rotational speed (for example the first core shaft in the example above). For example, the gearbox may be arranged to be driven only by the core shaft that is configured to rotate (for example in use) at the lowest rotational speed (for example only be the first core shaft, and not the second core shaft, in the example above). Alternatively, the gearbox may be arranged to be driven by any one or more shafts, for example the first and/or second shafts in the example above.

In any gas turbine engine as described and/or claimed herein, a combustor may be provided axially downstream of the fan and compressor(s). For example, the combustor may be directly downstream of (for example at the exit of) the second compressor, where a second compressor is provided. By way of further example, the flow at the exit to the combustor may be provided to the inlet of the second turbine, where a second turbine is provided. The combustor may be provided upstream of the turbine(s).

The or each compressor (for example the first compressor and second compressor as described above) may comprise any number of stages, for example multiple stages. Each stage may comprise a row of rotor blades and a row of stator vanes, which may be variable stator vanes (in that their angle of incidence may be variable). The row of rotor blades and the row of stator vanes may be axially offset from each other.

The or each turbine (for example the first turbine and second turbine as described above) may comprise any number of stages, for example multiple stages. Each stage may comprise a row of rotor blades and a row of stator vanes. The row of rotor blades and the row of stator vanes may be axially offset from each other.

Each fan blade may be defined as having a radial span extending from a root (or hub) at a radially inner gas-washed location, or 0% span position, to a tip at a 100% span position. The ratio of the radius of the fan blade at the hub to the radius of the fan blade at the tip may be less than (or on the order of) any of: 0.4, 0.39, 0.38 0.37, 0.36, 0.35, 0.34, 0.33, 0.32, 0.31, 0.3, 0.29, 0.28, 0.27, 0.26, or 0.25. The ratio of the radius of the fan blade at the hub to the radius of the fan blade at the tip may be in an inclusive range bounded by any two of the values in the previous sentence (i.e. the values may form upper or lower bounds). These ratios may commonly be referred to as the hub-to-tip ratio. The radius at the hub and the radius at the tip may both be measured at the leading edge (or axially forwardmost) part of the blade. The hub-to-tip ratio refers, of course, to the gas-washed portion of the fan blade, i.e. the portion radially outside any platform.

The radius of the fan may be measured between the engine centreline and the tip of a fan blade at its leading edge. The fan diameter (which may simply be twice the radius of the fan) may be greater than (or on the order of) any of: 250 cm (around 100 inches), 260 cm, 270 cm (around 105 inches), 280 cm (around 110 inches), 290 cm (around 115 inches), 300 cm (around 120 inches), 310 cm, 320 cm (around 125 inches), 330 cm (around 130 inches), 340 cm (around 135 inches), 350 cm, 360 cm (around 140 inches), 370 cm (around 145 inches), 380 (around 150 inches) cm or 390 cm (around 155 inches). The fan diameter may be in an inclusive range bounded by any two of the values in the previous sentence (i.e. the values may form upper or lower bounds).

The rotational speed of the fan may vary in use. Generally, the rotational speed is lower for fans with a higher diameter. Purely by way of non-limitative example, the rotational speed of the fan at cruise conditions may be less than 2500 rpm, for example less than 2300 rpm. Purely by way of further non-limitative example, the rotational speed of the fan at cruise conditions for an engine having a fan diameter in the range of from 250 cm to 300 cm (for example 250 cm to 280 cm) may be in the range of from 1700 rpm to 2500 rpm, for example in the range of from 1800 rpm to 2300 rpm, for example in the range of from 1900 rpm to 2100 rpm. Purely by way of further non-limitative example, the rotational speed of the fan at cruise conditions for an engine having a fan diameter in the range of from 320 cm to 380 cm may be in the range of from 1200 rpm to 2000 rpm, for example in the range of from 1300 rpm to 1800 rpm, for example in the range of from 1400 rpm to 1600 rpm.

In use of the gas turbine engine, the fan (with associated fan blades) rotates about a rotational axis. This rotation results in the tip of the fan blade moving with a velocity $U_{tip}$. The work done by the fan blades 13 on the flow results in an enthalpy rise dH of the flow. A fan tip loading may be defined as $dH/U_{tip}^2$, where dH is the enthalpy rise (for example the 1-D average enthalpy rise) across the fan and $U_{tip}$ is the (translational) velocity of the fan tip, for example at the leading edge of the tip (which may be defined as fan tip radius at leading edge multiplied by angular speed). The fan tip loading at cruise conditions may be greater than (or on the order of) any of: 0.3, 0.31, 0.32, 0.33, 0.34, 0.35, 0.36, 0.37, 0.38, 0.39 or 0.4 (all units in this paragraph being $Jkg^{-1}K^{-1}/(ms^{-1})^2$). The fan tip loading may be in an inclusive range bounded by any two of the values in the previous sentence (i.e. the values may form upper or lower bounds).

A fan blade and/or aerofoil portion of a fan blade described and/or claimed herein may be manufactured from any suitable material or combination of materials. For example at least a part of the fan blade and/or aerofoil may be manufactured at least in part from a composite, for example a metal matrix composite and/or an organic matrix composite, such as carbon fibre. By way of further example at least a part of the fan blade and/or aerofoil may be manufactured at least in part from a metal, such as a titanium based metal or an aluminium based material (such as an aluminium-lithium alloy) or a steel based material. The fan blade may comprise at least two regions manufactured using different materials. For example, the fan blade may have a protective leading edge, which may be manufactured using a material that is better able to resist impact (for example from birds, ice or other material) than the rest of the blade. Such a leading edge may, for example, be manufactured using titanium or a titanium-based alloy. Thus, purely by way of example, the fan blade may have a carbon-fibre or aluminium based body (such as an aluminium lithium alloy) with a titanium leading edge.

A fan as described and/or claimed herein may comprise a central portion, from which the fan blades may extend, for example in a radial direction. The fan blades may be attached to the central portion in any desired manner. For example, each fan blade may comprise a fixture which may engage a corresponding slot in the hub (or disc). Purely by way of example, such a fixture may be in the form of a dovetail that may slot into and/or engage a corresponding slot in the hub/disc in order to fix the fan blade to the hub/disc. By way of further example, the fan blades maybe formed integrally with a central portion. Such an arrangement may be referred to as a blisk or a bling. Any suitable method may be used to manufacture such a blisk or bling. For example, at least a part of the fan blades may be machined from a block and/or at least part of the fan blades may be attached to the hub/disc by welding, such as linear friction welding.

The gas turbine engines described and/or claimed herein may or may not be provided with a variable area nozzle (VAN). Such a variable area nozzle may allow the exit area of the bypass duct to be varied in use. The general principles of the present disclosure may apply to engines with or without a VAN.

The fan of a gas turbine as described and/or claimed herein may have any desired number of fan blades, for example 16, 18, 20, or 22 fan blades.

Embodiments will now be described by way of example only, with reference to the Figures, in which.

Figure 1:
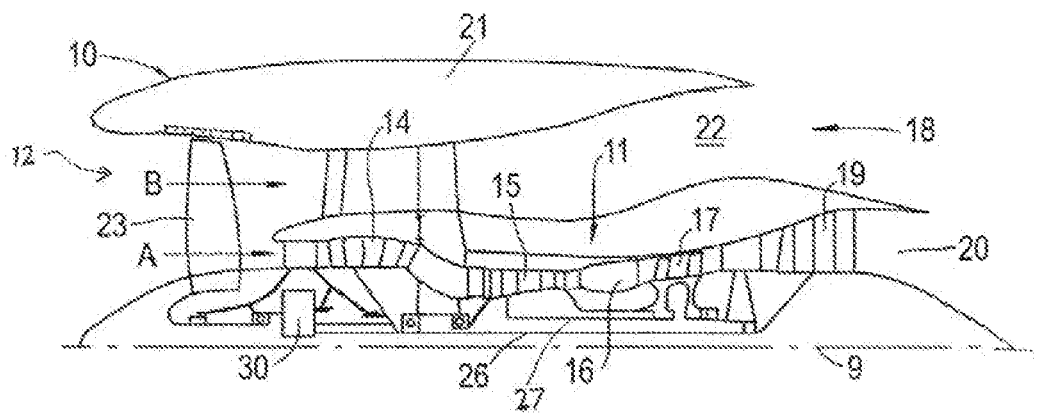
FIG. 1 is a sectional side view of a gas turbine engine.

FIG. 1 illustrates a gas turbine engine 10 having a principal rotational axis 9. The engine 10 comprises an air intake 12 and a propulsive fan 23 that generates two airflows: a core airflow A and a bypass airflow B. The gas turbine engine 10 comprises a core 11 that receives the core airflow A. The engine core 11 comprises, in axial flow series, a low pressure compressor 14, a high-pressure compressor 15, combustion equipment 16, a high-pressure turbine 17, a low pressure turbine 19 and a core exhaust nozzle 20. A nacelle 21 surrounds the gas turbine engine 10 and defines a bypass duct 22 and a bypass exhaust nozzle 18. The bypass airflow B flows through the bypass duct 22. The fan 23 is attached to and driven by the low pressure turbine 19 via a shaft 26 and an epicyclic gearbox 30.

In use, the core airflow A is accelerated and compressed by the low pressure compressor 14 and directed into the high pressure compressor 15 where further compression takes place. The compressed air exhausted from the high pressure compressor 15 is directed into the combustion equipment 16 where it is mixed with fuel and the mixture is combusted. The resultant hot combustion products then expand through, and thereby drive, the high pressure and low pressure turbines 17, 19 before being exhausted through the nozzle 20 to provide some propulsive thrust. The high pressure turbine 17 drives the high pressure compressor 15 by a suitable interconnecting shaft 27. The fan 23 generally provides the majority of the propulsive thrust. The epicyclic gearbox 30 is a reduction gearbox.

Figure 2:
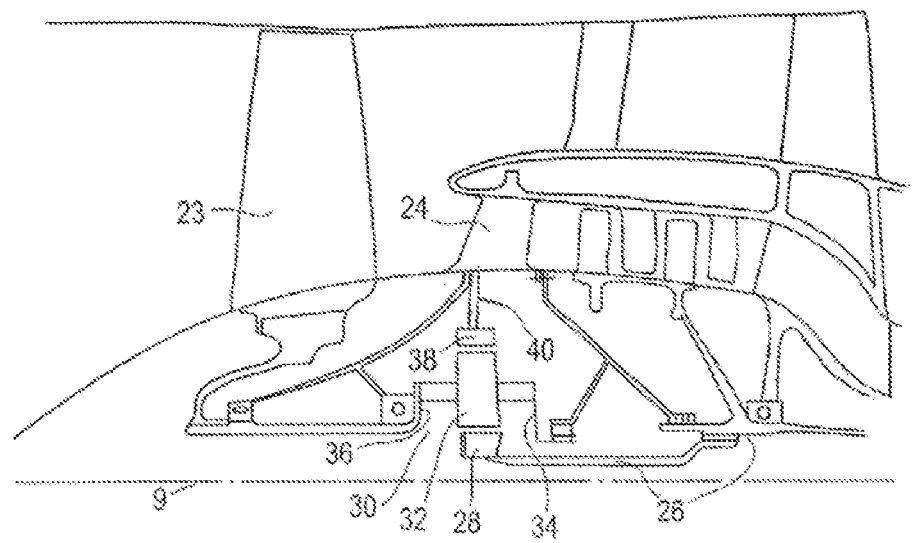
FIG. 2 is a close up sectional side view of an upstream portion of a gas turbine engine.

An exemplary arrangement for a geared fan gas turbine engine 10 is shown in FIG. 2. The low pressure turbine 19 (see FIG. 1) drives the shaft 26, which is coupled to a sun wheel, or sun gear, 28 of the epicyclic gear arrangement 30. Radially outwardly of the sun gear 28 and intermeshing therewith is a plurality of planet gears 32 that are coupled together by a planet carrier 34. The planet carrier 34 constrains the planet gears 32 to precess around the sun gear 28 in synchronicity whilst enabling each planet gear 32 to rotate about its own axis. The planet carrier 34 is coupled via linkages 36 to the fan 23 in order to drive its rotation about the engine axis 9. Radially outwardly of the planet gears 32 and intermeshing therewith is an annulus or ring gear 38 that is coupled, via linkages 40, to a stationary supporting structure 24.

Note that the terms "low pressure turbine" and "low pressure compressor" as used herein may be taken to mean the lowest pressure turbine stages and lowest pressure compressor stages (i.e. not including the fan 23) respectively and/or the turbine and compressor stages that are connected together by the interconnecting shaft 26 with the lowest rotational speed in the engine (i.e. not including the gearbox output shaft that drives the fan 23). In some literature, the "low pressure turbine" and "low pressure compressor" referred to herein may alternatively be known as the "intermediate pressure turbine" and "intermediate pressure compressor". Where such alternative nomenclature is used, the fan 23 may be referred to as a first, or lowest pressure, compression stage.

Other gas turbine engines to which the present disclosure may be applied may have alternative configurations. For example, such engines may have an alternative number of compressors and/or turbines and/or an alternative number of interconnecting shafts. By way of further example, the gas turbine engine shown in FIG. 1 has a split flow nozzle 20, 22 meaning that the flow through the bypass duct 22 has its own nozzle that is separate to and radially outside the core engine nozzle 20. However, this is not limiting, and any aspect of the present disclosure may also apply to engines in which the flow through the bypass duct 22 and the flow through the core 11 are mixed, or combined, before (or upstream of) a single nozzle, which may be referred to as a mixed flow nozzle. One or both nozzles (whether mixed or split flow) may have a fixed or variable area. Whilst the described example relates to a turbofan engine, the disclosure may apply, for example, to any type of gas turbine engine, such as an open rotor (in which the fan stage is not surrounded by a nacelle) or turboprop engine, for example. In some arrangements, the gas turbine engine 10 may not comprise a gearbox 30.

The geometry of the gas turbine engine 10, and components thereof, is defined by a conventional axis system, comprising an axial direction (which is aligned with the rotational axis 9), a radial direction (in the bottom-to-top direction in FIG. 1), and a circumferential direction (perpendicular to the page in the FIG. 1 view). The axial, radial and circumferential directions are mutually perpendicular.

Figure 3:
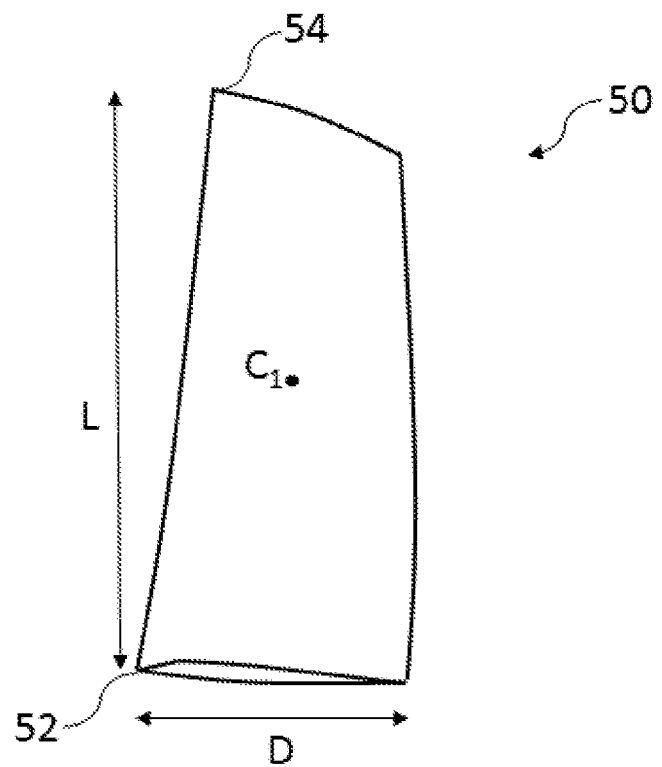
FIG. 3 shows a side view of a baseline aerofoil shape.

FIG. 3 schematically shows a side view of a baseline aerofoil shape 50. The baseline aerofoil shape 50 extends in a spanwise direction from a hub 52 to a tip 54 along a length L (or span). The baseline aerofoil shape 50 has been designed to meet airflow guidance requirements within a gas turbine engine, while also meeting integrity requirements. The baseline aerofoil shape has a depth D in a chordwise direction. The baseline aerofoil has a thickness which is orthogonal to both the length L and the depth D. The baseline aerofoil shape has a centre of gravity $C_1$.

Figure 4:
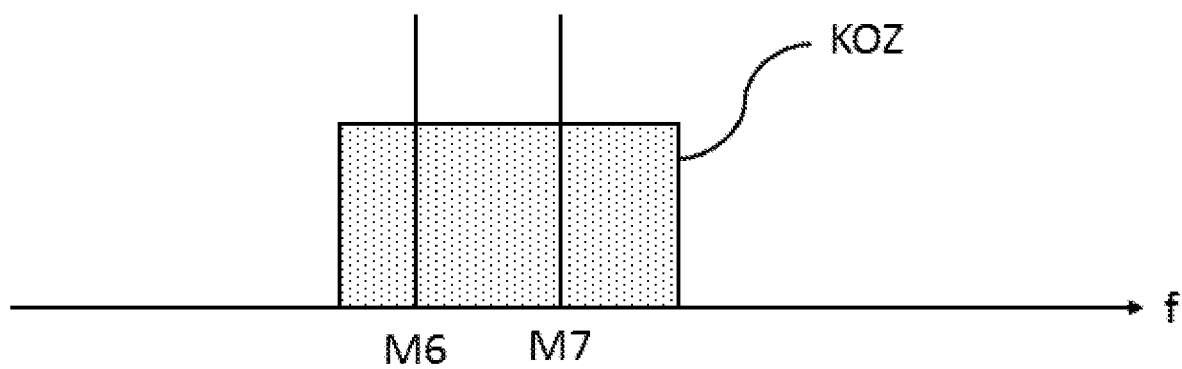
FIG. 4 shows a frequency spectrum indicating two resonant frequencies of the baseline aerofoil shape of FIG. 3 relative to a keep out zone for a given engine.

FIG. 4 shows a frequency spectrum. The x-axis of the frequency spectrum represents increasing frequency from left to right. A 'keep out zone' (KOZ) for a given gas turbine engine is illustrated on the frequency spectrum.

The illustrated KOZ is a continuous range of frequencies running from a lower limit to an upper limit. However, in alternative examples the KOZ could have one or more gaps in the range of frequencies between the lower limit and upper limit, (which may be considered equivalent to there being a plurality of discrete KOZs). If an aerofoil within the given gas turbine engine has a natural resonant frequency that falls within the KOZ it may be excited and become damaged through vibration. The frequency of an excitation source in a gas turbine engine may vary with engine speed, and so the KOZ of frequencies may be determined with a lower limit corresponding to an engine operating at its idling speed and an upper limit corresponding to the engine operating at maximum speed. Alternatively, a KOZ may be selected based on a cruising speed of the engine at which the engine would most commonly operate in practice, or another operating point.

The resonant frequencies of the baseline aerofoil shape are determined according to previously-considered techniques (e.g. modal analysis by computer simulation). Two natural resonant frequencies of the baseline aerofoil shape 50 which are adjacent in the frequency domain are shown on the frequency spectrum: mode 6 (M6) and mode 7 (M7). In the illustrated example, these two modes fall within the KOZ. In some examples, two frequencies falling within the KOZ may not be sequential modes, but may nevertheless represent natural resonant frequencies which are adjacent in the frequency domain.

Figure 5:
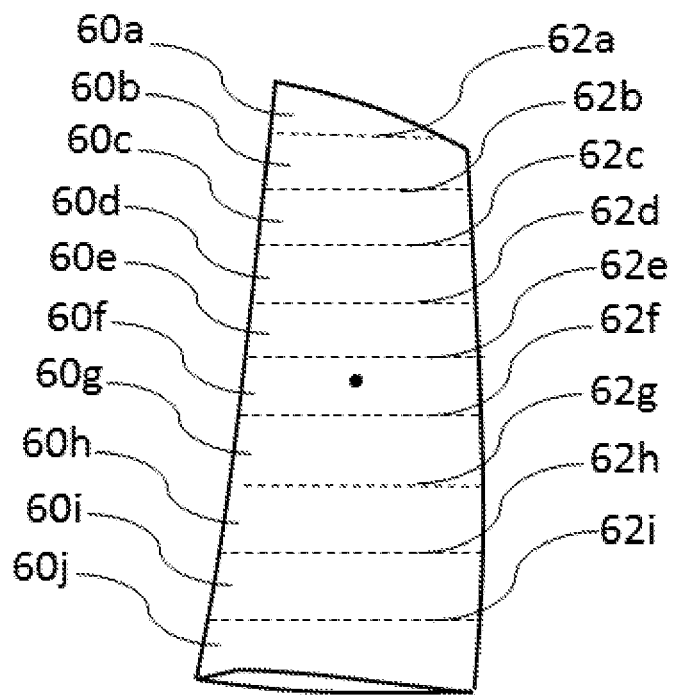
FIG. 5 shows the baseline aerofoil shape of FIG. 3 divided by sections.

FIG. 5 schematically shows a side view of the baseline aerofoil shape 50 shown in FIG. 3. The baseline aerofoil shape has been divided into ten aerofoil portions 60a-j by nine sections 62a-i. Each section comprises a two-dimensional slice having a shape corresponding to the cross-section of the baseline aerofoil shape at each respective spanwise location of the section taken orthogonal to the spanwise axis.

In order to shift the natural resonant frequencies of the baseline aerofoil shape the section 62e is displaced in the chordwise direction from its baseline position in the baseline aerofoil shape. In this example, the section nearest to the centre of gravity $C_1$ in the spanwise direction has been displaced.

Figure 6:
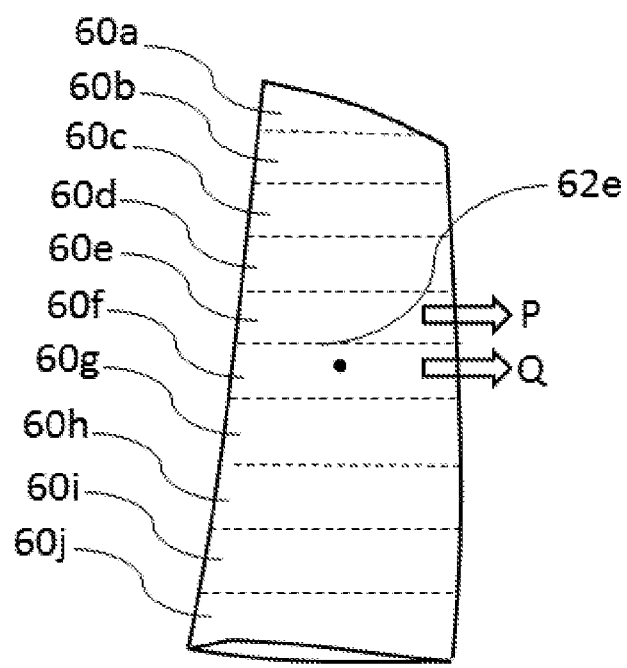
FIG. 6 shows the baseline aerofoil shape of FIG. 5 with direction of displacement of a section and its adjacent portions indicated.

As the remaining sections 62a-d and 62f-i remain in their respective baseline positions, the displacement of the section 62e causes the two aerofoil portions either side of the slice, sections 60f and 60g, to be deformed from their initial shapes as indicated by the arrows P and Q shown in FIG. 6. In the example illustrated the aerofoil portions 60f and 60g are deformed generally in the chordwise direction of the baseline aerofoil shape 50. In other examples, the effect of displacing a particular aerofoil section from the baseline aerofoil shape may be blended over a plurality of aerofoil sections resulting in deformation of more than two aerofoil portions.

Figure 7:
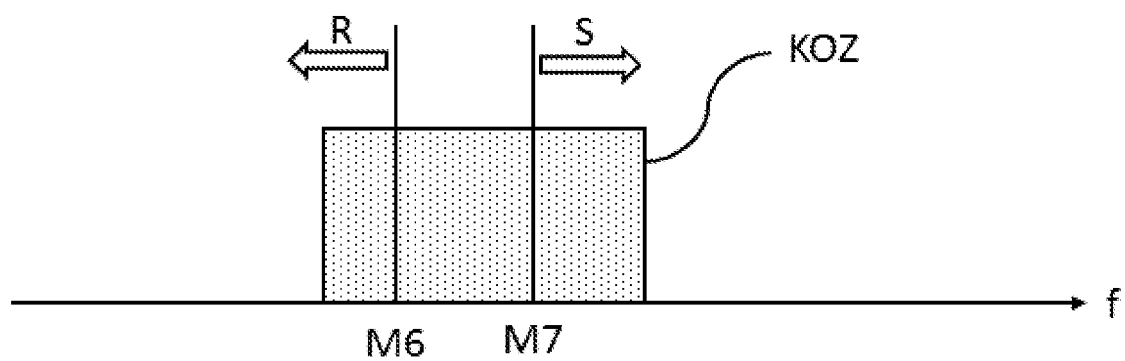
FIG. 7 shows the frequency spectrum of FIG. 4 with the effect of the displacement of FIG. 6 on the two resonant frequencies.

The resonant frequencies of the baseline aerofoil shape 50 are re-determined as the section 62e is displaced so that the position of the resonant frequencies relative to the KOZ can be monitored (for example, periodically determined at threshold displacement intervals). The effect of the displacement is indicated by arrows R and S in the frequency spectrum of FIG. 7. The resonant frequency mode 7 is shifted up in frequency and the resonant frequency mode 6 is simultaneously shifted down in frequency. This is an improvement over previously-considered solutions, in which the two adjacent modes could only be shifted in the same direction, i.e. either both shifted up in frequency, or both shifted down in frequency.

Figure 8:
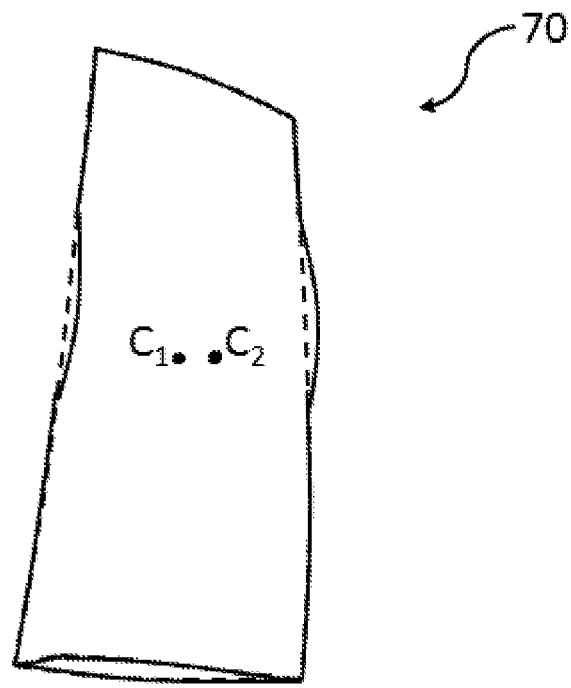
FIG. 8 shows a modified aerofoil shape.

FIG. 8 schematically shows a side view of a modified aerofoil shape 70. The modified aerofoil shape 70 corresponds to the baseline aerofoil shape 50 shown in FIG. 3 after the section 62e has been displaced from its baseline position, and the adjacent portions 60f and 60g have been deformed. For comparison, the baseline aerofoil shape 50 is superimposed in dashed lines.

The modified aerofoil shape 70 has a centre of gravity $C_2$. It can be seen that the centre of gravity $C_2$ of the modified aerofoil shape 70 has been displaced relative to the centre of gravity $C_1$ of the baseline aerofoil shape 50. In this example, the movement in the position of the centre of gravity is associated with a change in the resonant frequencies of the modified aerofoil shape 70.

In the illustrated example, it can be seen that the aerofoil portions at the hub and tip of the modified aerofoil shape substantially correspond in location and shape to the aerofoil portions at the base and tip of the baseline aerofoil shape, i.e. the sections 62a and 62i have not been displaced. This ensures that the modified aerofoil shape 70 still meets dimensional requirements fulfilled by the baseline aerofoil shape 50, e.g. tip clearance requirements (a minimum distance between the tip of the aerofoil and a housing of an engine in which the aerofoil is to be installed).

Figure 9:
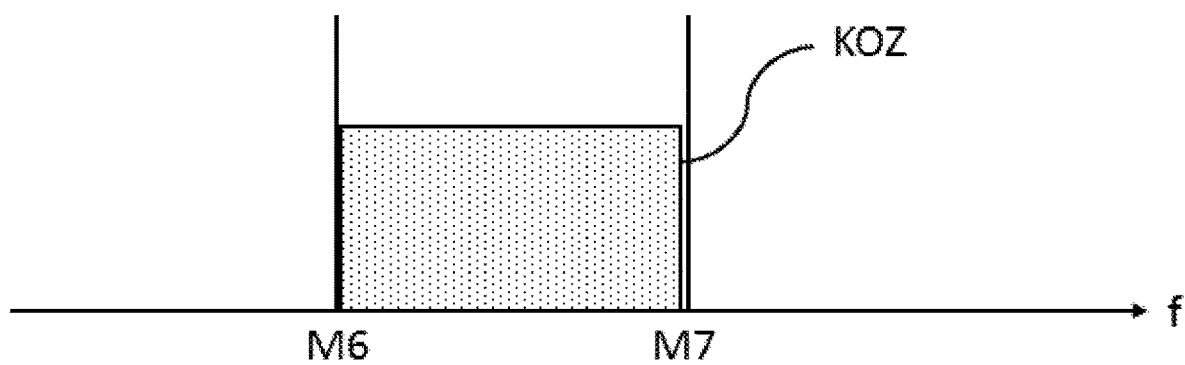
FIG. 9 shows a frequency spectrum indicating two resonant frequencies of the modified aerofoil shape of FIG. 8 relative to a keep out zone for a given engine.

The frequency spectrum of FIG. 9 shows the shifted resonant frequencies of the modified aerofoil shape 70. Both mode 6 and mode 7 now lie outside the KOZ, and so an aerofoil having the modified aerofoil shape 70 can be installed in the gas turbine engine corresponding to the KOZ without risk of damage to the aerofoil.

As can be seen in FIG. 9, displacement of the section 62e, and the deformation of the adjacent portions 60f and 60g, has been halted as soon as it has been determined that the natural frequencies of the modified aerofoil shape 70 lie outside the KOZ. This technique ensures that the baseline aerofoil shape 50 has been modified as little as possible whilst achieving the required shifting of the resonant frequencies. This, in turn, provides a modified aerofoil shape that has been deformed from a baseline shape (which may be optimal for other design criteria (e.g. integrity and aerodynamic requirements) as little as possible.

Figure 10:
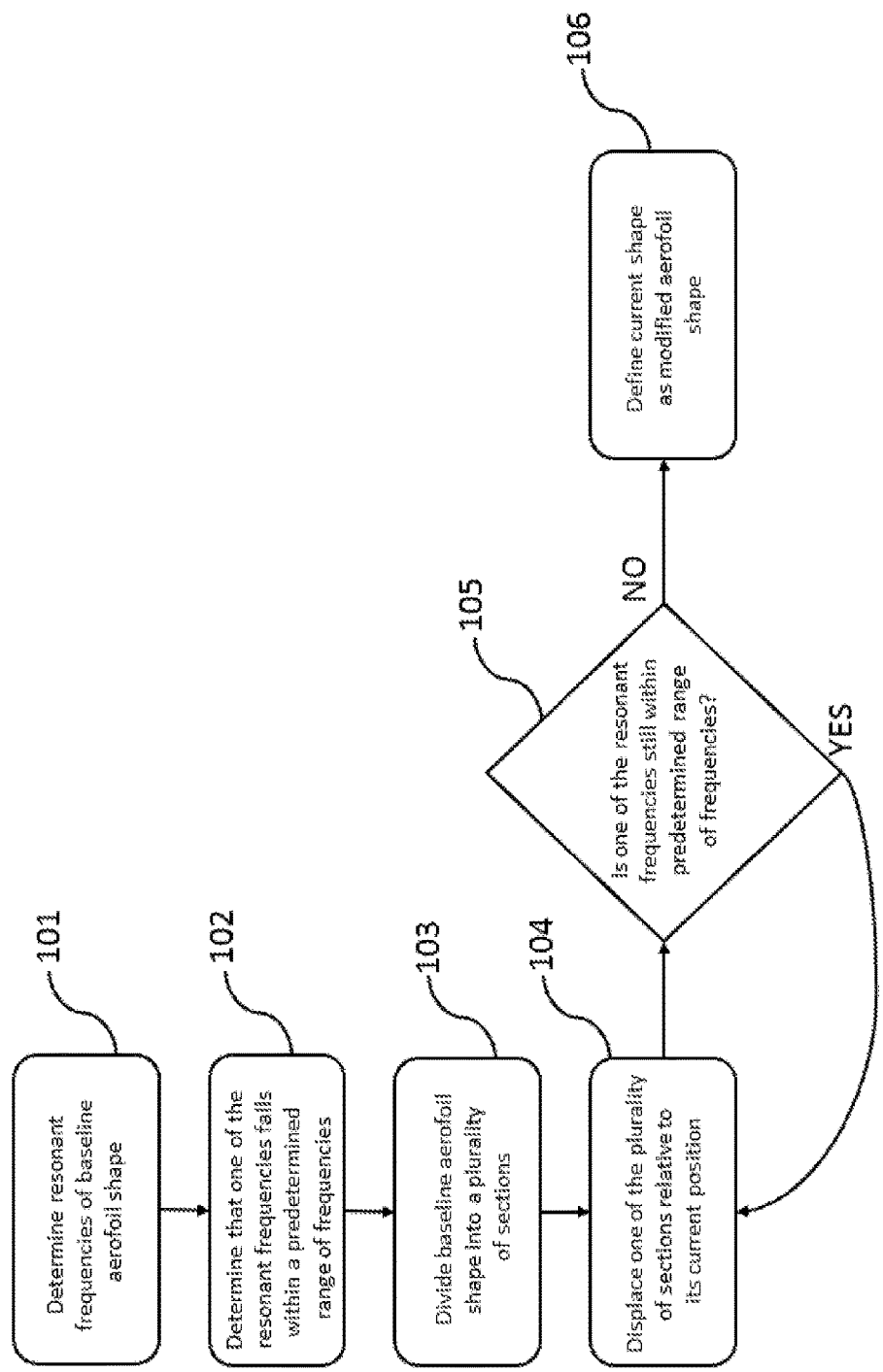
FIG. 10 shows a flowchart of a method according to an embodiment of the disclosure.

FIG. 10 shows a flowchart of a method according to an embodiment of the disclosure. In step 101 the resonant frequencies of a baseline aerofoil shape are determined. This can be carried out using an automated design tool on a computer.

In step 102 the resonant frequencies of the baseline aerofoil shape are compared to a predetermined range of frequencies. For example, the predetermined range of frequencies may be a keep out zone for a given engine in which an aerofoil having the baseline aerofoil shape is intended to be installed. The predetermined range can be determined by testing (either real-world tests or computer simulations) or can be calculated based on the technical specifications of a given engine.

In step 103 the baseline aerofoil shape is divided into a plurality of aerofoil portions by a plurality of sections. For example, the baseline aerofoil shape may be divided by a stack of N two-dimensional slices equally spaced apart along a span of the baseline aerofoil shape.

In step 104 one of the plurality of sections is displaced relative to its current position. To achieve the smallest incremental change to the baseline aerofoil shape the sections are advantageously moved one at a time. However, in some applications it may be preferable to move more than one section simultaneously (e.g. two adjacent sections).

In step 105 a check is performed as to whether one of the resonant frequencies of the displaced aerofoil shape (i.e. the baseline aerofoil shape with one or more sections displaced) still falls within the predetermined range of frequencies.

If one of the resonant frequencies still falls within the predetermined range of frequencies the method returns to step 104. In step 104, the same section that was previously displaced may be further displaced from its current position. Alternatively, a different section may be displaced from its current position (which may be a baseline position) and the section previously displaced may be returned to its baseline position.

If none of the resonant frequencies fall within the predetermined range of frequencies, the method moves on to step 106.

In step 106 the displaced aerofoil shape present during the last check at step 105 is defined as the modified aerofoil shape. An aerofoil can then be manufactured having the shape of the modified aerofoil shape. Said aerofoil can then be safely installed in an engine having a KOZ corresponding to the predetermined range of frequencies, as said aerofoil will not experience excitation and possible damage during operation of the engine.

It will be understood that the disclosure is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features described herein.

For example, while the baseline aerofoil shape in the illustrated example is divided into ten aerofoil portions of approximately equal size by nine sections, this need not be the case and any number of sections could be used in practice.

Additionally, while one section is displaced and two aerofoil portions are deformed in the illustrated example, any number of sections could be displaced and any number of portions could be deformed in practice. In some examples, such as the example shown in FIGS. 4-7, only a single section may be displaced. Conversely, almost all of the sections could be displaced, with e.g. only the sections closest to the hub and tip of the aerofoil remaining in their original places. In some examples, even the sections closest to the hub and tip of the aerofoil may be displaced.

While it has been found that shifting of the resonant frequencies of the baseline aerofoil shape can most effectively be achieved by displacing one or more section located approximately half way along the spanwise length of the baseline aerofoil shape in the chordwise direction, in practice sections can additionally or alternatively be moved in other directions (e.g. directions orthogonal to the chordwise direction), and this will also effect a displacement of the centre of gravity of the baseline aerofoil shape.

What is claimed is:

1. A method of designing and manufacturing a modified aerofoil shape, the method comprising the steps of:
    determining a plurality of resonant frequencies of a baseline aerofoil shape;
    determining that one of the resonant frequencies falls within a predetermined range of frequencies;
    providing a plurality of aerofoil sections that are two dimensional and define the baseline aerofoil shape as a plurality of volumes;
    defining a modified aerofoil shape by displacing at least one of the plurality of aerofoil sections relative to its baseline position in the baseline aerofoil shape so as to vary its position along a chord-wise axis of the baseline aerofoil shape while maintaining positions of two other aerofoil sections on opposite sides of the at least one of the plurality of airfoil sections, without changing a shape of the at least one of the plurality of aerofoil sections, until one of the plurality of resonant frequencies previously falling within the range of frequencies is shifted outside the range of frequencies; and
    manufacturing an aerofoil with the modified aerofoil shape.

2. The method according to claim 1, wherein the providing the plurality of aerofoil sections defining the baseline aerofoil shape comprises dividing the baseline aerofoil shape into a plurality of aerofoil sections.

3. The method according to claim 1, wherein one of the plurality of resonant frequencies previously falling within the range of frequencies is shifted past an upper limit of the predetermined range of frequencies.

4. The method according to claim 1, wherein one of the plurality of resonant frequencies previously falling within the range of frequencies is shifted past a lower limit of the predetermined range of frequencies.

5. The method according to claim 1, wherein the plurality of aerofoil sections comprises a stack of N two-dimensional slices equally spaced apart along a span of the baseline aerofoil shape.

6. The method according to claim 1, wherein the displacing at least one of the plurality of aerofoil sections relative to its baseline position comprises displacing an aerofoil section equidistant between a hub and a tip of the baseline aerofoil shape.

7. The method according to claim 6, wherein the aerofoil sections at the hub and the tip are not displaced.

8. The method according to claim 1, wherein the displacing at least one of the plurality of aerofoil sections relative to its baseline position comprises displacing an aerofoil section of the baseline aerofoil shape that is between 40-60% of a span of the aerofoil between a hub and a tip.

* * * * *